US010490739B2

(12) United States Patent
Chen et al.

(10) Patent No.: US 10,490,739 B2
(45) Date of Patent: Nov. 26, 2019

(54) ONE-TIME-PROGRAMMABLE RESISTIVE RANDOM ACCESS MEMORY AND METHOD FOR FORMING THE SAME

(71) Applicant: Winbond Electronics Corp., Taichung (TW)

(72) Inventors: Frederick Chen, Tainan (TW); Ping-Kun Wang, Taichung (TW); Chih-Cheng Fu, New Taipei (TW); Chien-Min Wu, Hsinchu (TW); Shao-Ching Liao, Tongluo Township, Miaoli County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/867,159

(22) Filed: Jan. 10, 2018

(65) Prior Publication Data

US 2019/0214556 A1    Jul. 11, 2019

(51) Int. Cl.
*H01L 45/00* (2006.01)
*G11C 13/00* (2006.01)
*H01L 27/24* (2006.01)

(52) U.S. Cl.
CPC ............ *H01L 45/08* (2013.01); *G11C 13/004* (2013.01); *G11C 13/0007* (2013.01); *H01L 27/2436* (2013.01); *H01L 27/2463* (2013.01); *H01L 45/1233* (2013.01); *H01L 45/1253* (2013.01); *H01L 45/146* (2013.01); *H01L 45/1608* (2013.01); *H01L 45/1641* (2013.01); *G11C 2013/0045* (2013.01); *G11C 2213/32* (2013.01); *G11C 2213/52* (2013.01); *G11C 2213/79* (2013.01)

(58) Field of Classification Search
CPC . H01L 45/08; H01L 27/2436; H01L 27/2463; H01L 45/1233; H01L 45/1253; H01L 45/146; H01L 45/1608; H01L 45/1641; G11C 13/0007; G11C 13/004; G11C 2013/0045; G11C 2213/32; G11C 2213/52; G11C 2213/79
USPC .......................................................... 257/4
See application file for complete search history.

(56) References Cited

U.S. PATENT DOCUMENTS 8,653,623 B2  2/2014  Lin et al.
9,336,876 B1 * 5/2016  Kumar ............... G11C 13/0069
(Continued)

OTHER PUBLICATIONS

N. Raghavan, K. L. Pey, X. Wu, W. Liu and M. Bosman, "Percolative Model and Thermodynamic Analysis of Oxygen-Ion-Mediated Resistive Switching," in *IEEE Electron Device Letters*, May 2012, pp. 712-714, vol. 33, No. 5.

*Primary Examiner* — Didarul A Mazumder
(74) *Attorney, Agent, or Firm* — Muncy, Geissler, Olds & Lowe, P.C.

(57) ABSTRACT

A method of forming a one-time-programmable resistive random access memory bit includes forming a resistive switching layer on a bottom electrode layer. The method also includes forming a top electrode layer on the resistive switching layer. The method also includes applying a forming voltage to the resistive switching layer, such that the electric potential of the top electrode layer is lower than that of the bottom electrode layer. The method also includes performing a bake process on the resistive switching layer. The vacancies in the resistive switching layer are randomly distributed.

12 Claims, 7 Drawing Sheets

(56) References Cited

U.S. PATENT DOCUMENTS

| | | | | |
|---|---|---|---|---|
| 2012/0001148 A1* | 1/2012 | Miller | ................ | H01L 27/2409 |
| | | | | 257/4 |
| 2013/0062587 A1* | 3/2013 | Lee | ................ | H01L 45/08 |
| | | | | 257/4 |
| 2015/0016178 A1* | 1/2015 | Nardi | ................ | H01L 45/08 |
| | | | | 365/148 |
| 2015/0093876 A1* | 4/2015 | Butcher | ................ | H01L 45/08 |
| | | | | 438/382 |

* cited by examiner

ONE-TIME-PROGRAMMABLE RESISTIVE RANDOM ACCESS MEMORY AND METHOD FOR FORMING THE SAME

BACKGROUND

Technical Field

The disclosure relates to a semiconductor structure and more particularly to a one-time-programmable resistive random access memory.

Description of the Related Art

Resistive random access memory (RRAM) has many advantages, including a simple structure, smaller area, lower operation voltage, faster speed, longer retention time, lower cost, and being easier to integrate with other processes. It has great potential to become the mainstream non-volatile memory of the next generation.

In the field of encryption, a secure key is a randomly generated string. The key must not be directly read from any memory. Instead, it is extracted from a physically unclonable function (PUF). The PUF must be randomly generated and able to be repeatedly used even after high-temperature thermal cycling.

It is expected that the security code may be programmed only once by a one-time-programmable (OTP) device, but also provide a combination of array bits that randomly varies from chip to chip. Ideally, if a parameter is uniformly distributed, the probability of finding the parameter at each interval is the same. However, using conventional OTP approaches like antifuses, the parameter such as the reading current is normally distributed rather than randomly distributed. In addition, the bit combination also needs to be thermally stable and easy to implement in an embedded CMOS process. For these reasons, a one-time-programmable resistive random access memory (OTP RRAM) physically unclonable function (PUF) is a natural choice.

Although existing types of one-time-programmable resistive random access memory have generally been adequate for their intended purposes, they have not been entirely satisfactory in all respects and need to be improved, especially with respect to the randomness and thermal stability of the reading current.

BRIEF SUMMARY

The present disclosure provides a method of forming a one-time-programmable resistive random access memory bit includes forming a resistive switching layer on a bottom electrode layer. The method also includes forming a top electrode layer on the resistive switching layer. The method also includes applying a forming voltage to the resistive switching layer, such that the electric potential of the top electrode layer is lower than that of the bottom electrode layer. The method also includes performing a bake process on the resistive switching layer. The vacancies in the resistive switching layer are randomly distributed.

The present disclosure also provides a one-time-programmable resistive random access memory bit includes a bottom electrode layer and a resistive switching layer formed on the bottom electrode layer. The one-time-programmable resistive random access memory bit also includes a top electrode layer formed on the resistive switching layer. The vacancies in the resistive switching layer are randomly distributed.

The present disclosure further provides a one-time-programmable resistive random access memory that includes a transistor and the above-mentioned one-time-programmable resistive random access memory bits. The bottom electrode layers of the one-time-programmable resistive random access memory bits are electrically connected to the drain of the transistor, and the top electrode layers of the one-time-programmable resistive random access memory bits are electrically connected to bit lines.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a one-time-programmable resistive random access memory bit in which a resistive switching layer is a thin structure. The resistive switching layer is an amorphous structure or a multi-grain structure with a small grain size. By applying a negative forming voltage and a baking process on the resistive switching layer, the vacancies in the resistive switching layer are randomly distributed. Therefore, the resistance of the resistive switching layer and the reading current are random values. The reading current generally remains unchanged even after more high-temperature thermal cycling.

Figure 1:
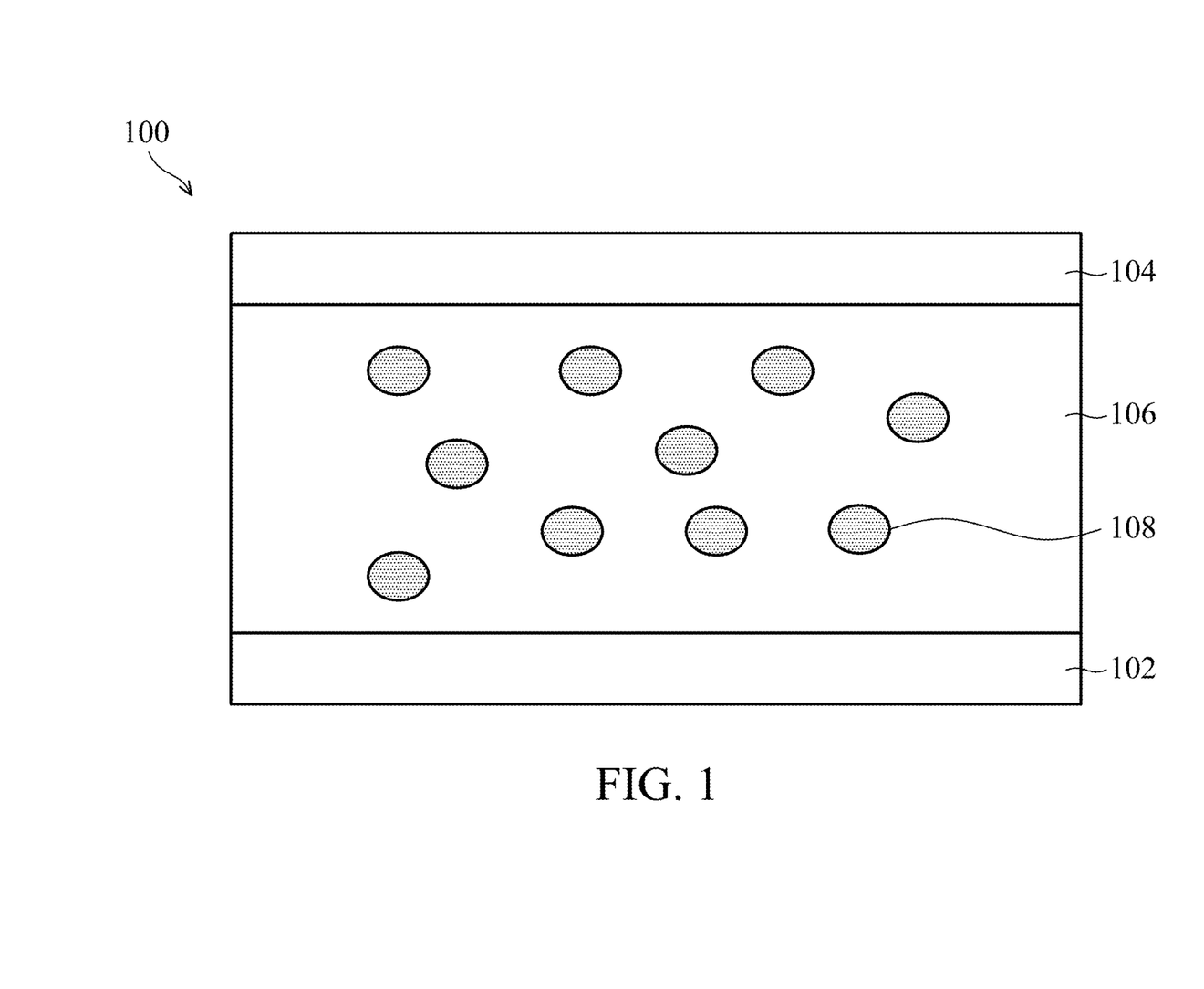
FIG. 1 is a cross-sectional representation of a one-time-programmable resistive random access memory bit in accordance with some embodiments.

FIG. 1 is a cross-sectional representation of a one-time-programmable resistive random access memory bit 100 in accordance with some embodiments of the present disclosure. As shown in FIG. 1, the one-time-programmable resistive random access memory bit 100 includes a bottom electrode layer 102, a top electrode layer 104, and a resistive switching layer 106 between the bottom electrode layer 102 and the top electrode layer 104.

In some embodiments, a bottom electrode layer 102 is formed on a substrate (not shown). The substrate may include a semiconductor substrate or another suitable substrate. In some embodiments, the substrate is a semiconductor substrate, such as a silicon substrate. Moreover, the semiconductor substrate may also include other elementary semiconductors such as Ge; compound semiconductors such as GaN, SiC, GaAs, GaP, InP, InAs, and/or InSb; alloy semiconductors such as SiGe, GaAsP, AlInAs, AlGaAs, GaInAs, GaInP, and/or GaInAsP, or a combination thereof. In addition, the substrate may also be semiconductor on insulator (SOI). The SOI substrate may be fabricated using a wafer bonding process, a silicon film transfer process, a separation by implantation of oxygen (SIMOX) process, another applicable method, or a combination thereof.

In some embodiments, the bottom electrode layer 102 includes metal nitride, TaN, TiN, TiAlN, TiW, WN, Ti, Au, Ta, Ag, Cu, AlCu, Pt, W, Ru, Al, Ni, other suitable electrode material, or a combination thereof. In some embodiments, the electrode material is deposited on the substrate to form the bottom electrode layer 102 by a chemical vapor deposition process (CVD), a physical vapor deposition process (PVD) (e.g., e-beam evaporation, resistive heating evaporation, or sputtering), an atomic layer deposition process (ALD), an electroplating process, other suitable processes, or a combination thereof; and then a chemical mechanical polishing (CMP) process or an etching back process is optionally performed to remove the excess electrode materials. In some embodiments, by using a patterning process, the electrode material may be patterned to form the desired bottom electrode layer 102. The patterning process includes a photolithography process and an etching process. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof.

Next, as shown in FIG. 1, a resistive switching layer 106 is formed on the bottom electrode layer 102. In some embodiments, the resistive switching layer 106 may include dielectric material which is usually electrical insulating. In some embodiments, the resistive switching layer 106 may include oxides, nitrides, other suitable dielectric materials, or a combination thereof. For example, the resistive switching layer 106 may include hafnium oxide, zirconium oxide, titanium oxide, tantalum oxide, tungsten oxide, aluminum oxide, zinc oxide, nickel oxide, copper oxide, other suitable dielectric materials, or a combination thereof. In some embodiments, a dielectric material is deposited on the bottom electrode layer 102 to form the resistive switching layer 106 by an atomic layer deposition (ALD) process, a chemical vapor deposition (CVD) process, a physical vapor deposition (PVD) process, a spin coating process, a spray coating process, other applicable processes, or a combination thereof. In some embodiments, the resistive switching layer 106 is doped with other elements. In some embodiments, the deposited dielectric material is patterned by a lithography process and an etching process so that the resistive switching layer 106 has the desired pattern. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof. In some embodiments, the resistive switching layer 106 is formed under a temperature of 250° C. and 300° C. If the temperature is too high, crystallization may be excessive. In the temperature is too low, the film may contain more defects or contamination.

As shown in FIG. 1 according to some embodiments, there are vacancies 108 such as oxygen or nitrogen vacancies in the resistive switching layer 106. The distribution of the vacancies 108 determines the resistance of the resistive switching layer 106, and further impacts the reading current. If the vacancies 108 are more randomly distributed, the reading current of the one-time-programmable resistive random access memory bit 100 is more likely to be a random value. Therefore, reading currents of different one-time-programmable resistive random access memory bits 100 are also more randomly distributed. If the vacancies 108 are more concentrated or exhibit a concentrated distribution, the reading current of the one-time-programmable resistive random access memory bit 100 more likely to be a certain value rather than a random value. Therefore, reading currents of different one-time-programmable resistive random access memory bits 100 are not randomly distributed.

In some embodiments, to make the vacancies 108 in the resistive switching layer 106 more randomly distributed, the resistive switching layer 106 may include amorphous materials such as $HfO_2$ or $ZrO_2$ doped by Al, Si, N, Ta, Ti, other suitable amorphous materials, or a combination thereof. The vacancies 108 are more randomly distributed in amorphous materials as compared to crystalline materials. Besides, the dopant in the amorphous material may hinder crystallization. In some embodiments, the dopant concentration in the resistive switching layer 106 is between 2% and 10%. On the other hand, if the resistive switching layer 106 includes crystalline materials, the vacancies 108 may easily recombine at the grain boundaries, resulting in a more concentrated distribution.

In some embodiments, the resistive switching layer 106 may include multi-grain materials with grain size from 1 nm to 200 nm. Since the grain size is small enough, the vacancies 108 are still randomly distributed in multi-grain materials as compared to crystalline materials. In some embodiments, the resistive switching layer 106 may include multi-grain (polycrystalline) materials where crystallization has started to proceed.

In some embodiments, the thickness of the resistive switching layer 106 is between 1 nm and 3 nm. If the resistive switching layer 106 is too thick, the forming voltage may raise and consume power. If the resistive switching layer 106 is too thin, on the other hand, the vacancies 108 in the resistive switching layer 106 may overpopulate the film.

Next, as shown in FIG. 1, a top electrode layer 104 is formed on the resistive switching layer 106. The materials of the top electrode layer 104 and the bottom electrode layer 102 may be the same or different. In some embodiments, the top electrode layer 104 may include metal nitride, TaN, TiN, TiAlN, TiW, WN, Ti, Au, Ta, Ag, Cu, AlCu, Pt, W, Ru, Al, Ni, other suitable electrode materials, or a combination thereof. In some embodiments, the material of the top electrode layer 104 promotes the generation of vacancies 108. In some embodiments, the electrode material is deposited on the resistive switching layer 106 to form the top electrode layer 104 by a chemical vapor deposition process (CVD), a physical vapor deposition process (PVD) (e.g., e-beam evaporation, resistive heating evaporation, or sputtering), an atomic layer deposition process (ALD), an electroplating process, another suitable process, or a combination thereof, and then a chemical mechanical polishing (CMP) process or an etching back process is optionally performed to remove the excess electrode materials. In some embodiments, by using a patterning process, the electrode material may be patterned to form the desired top electrode layer 104. The patterning process includes a photolithography process and an etching process. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof.

In the above description, the bottom electrode layer 102, the top electrode layer 104, and the resistance switching layer 106 are patterned respectively. However, the bottom electrode layer 102, the top electrode layer 104, and the resistance switching layer 106 may be patterned simultaneously after all three layers are deposited.

Embodiments of the disclosure may have many variations. For example, another material layer such as a buffer layer and/or a barrier layer may be formed between the electrode layers 102/104 and the resistance switching layer 106, on the top electrode layers 104, or under the bottom electrode layers 102. In some embodiments, the barrier layer is formed of insulators or dielectrics such as silicon nitride, silicon carbide, silicon carbonitride, or other oxygen-free barrier materials. In some embodiments, the barrier layer may be formed by sputtering, chemical vapor deposition (CVD), or other suitable deposition processes. The barrier layer may prevent oxygen diffuse in the electrode layers 102/104, and furthermore prevent unexpected resistance variations. In some embodiments, the buffer layer is formed of oxygen scavenging metal, such as Ti, Hf, Ta, other suitable metals, and a combination thereof. In some embodiments, the barrier layer may be formed by sputtering, chemical vapor deposition (CVD), atomic vapor deposition (ALD), or other suitable deposition processes. The buffer layer may be oxidized in the process. Therefore, the interface between the buffer layer and the resistance switching layer 106 may be oxygen-deficient, which may improve switching properties.

It should be noted that the bottom electrode layer 102, the top electrode layer 104, and the resistance switching layer 106 in FIG. 1 have the same shape and the same area. However, embodiments of the disclosure are not limited thereto. The bottom electrode layer 102, the top electrode layer 104, and the resistance switching layer 106 of a one-time-programmable resistive random access memory bit 100 may be any shape and any kind of stack as long as the one-time-programmable resistive random access memory bit 100 works. For example, the bottom electrode layer 102 and the top electrode layer 104 may be electrode bars perpendicular to each other with the resistance switching layer 106 between them at the intersection.

Figure 2:
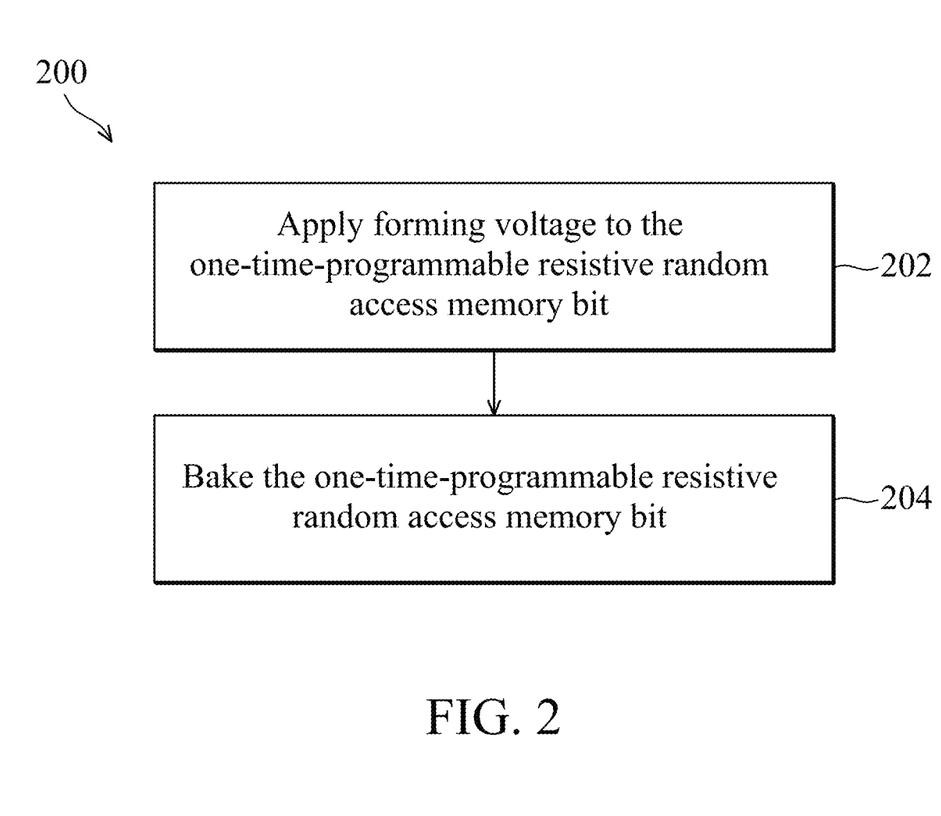
FIG. 2 is a flow chart of forming a one-time-programmable resistive random access memory bit in accordance with some embodiments.

FIG. 2 is a flow chart of a method 200 of forming a one-time-programmable resistive random access memory bit 100 in accordance with some embodiments. As shown in FIG. 2, the method 200 begins with a step 202, in which a forming voltage is applied to the one-time-programmable resistive random access memory bit 100. In some embodiments, applying the forming voltage includes making the electric potential of the top electrode layer 104 lower than that of the bottom electrode layer 102, i.e., a negative forming voltage. While applying a negative forming voltage on the one-time-programmable resistive random access memory bit 100, the vacancies 108 in the resistive switching layer 106 are randomly distributed. Therefore, the resistance of the resistive switching layer 106 and the reading current are both random values. On the other hand, if the forming voltage includes making the electric potential of the top electrode layer 104 higher than the electric potential of the bottom electrode layer 102 (i.e., a positive forming voltage), the vacancies in the resistive switching layer 106 may easily gather to form conductive filaments, and as a result, the resistance of the resistive switching layer 106 and the reading current are more likely fixed values than random values.

In some embodiments, the forming voltage in the step 202 is between 2 V and 8 V. In some embodiments, the forming voltage in the step 202 is between 3 V and 6 V. The forming voltage provides a current between 500 µA and 600 µA and a pulse width between 1 µs and 100 µs. If the forming voltage is too high, it will consume power. If the forming voltage is too low, it may not be enough to generate enough vacancies 108 in the resistive switching layer 106.

Next, the method 200 proceeds to a step 204, in which the one-time-programmable resistive random access memory bit 100 is baked. The baking process may reduce the gradient of the vacancies 108 distributed in the resistive switching layer 106. After baking, the vacancies 108 are more randomly distributed. As a result, the resistance of the resistive switching layer 106 and the reading current are both random values. Furthermore, the baking may enhance thermal stability by lowering the gradient of the vacancies 108 distribution. The distribution of the vacancies 108 will not change even with more high-temperature thermal cycling. In addition, the baking may also increase the probability of generating percolation path, which in turn increases the reading current. Ideally, each of one-time-programmable resistive random access memory bits in a given array has distinctly different values of reading current to result in a uniform distribution of reading current across the entire range. A wider reading current range may allow more bits and further increase the bit density.

In some embodiments, the temperature of the baking process in the step 204 is between 200° C. and 300° C., and the duration time of the bake process in the step 204 is between 1 minute and 300 minutes. In some embodiments, the temperature of the baking process in the step 204 is between 220° C. and 280° C., and the duration time of the bake process in the step 204 is between 5 minutes and 200 minutes. If the baking temperature is too low or the duration time is too short, it is not easy to make the vacancies 108 randomly distributed. If the baking temperature is too high or the duration time is too long, the process time and cost will rise.

By applying a negative forming voltage and performing a baking process on a one-time-programmable resistive random access memory bit, the vacancies in the resistive switching layer may be randomly distributed. The resistance of the one-time-programmable resistive random access memory bit and the reading current are randomly values. Therefore, the reading currents from different one-time-programmable resistive random access memory bits are also randomly distributed in a wide range. The reading current is stable in thermal cycling, so the data generally remains unchanged even at high temperature.

Figure 3:
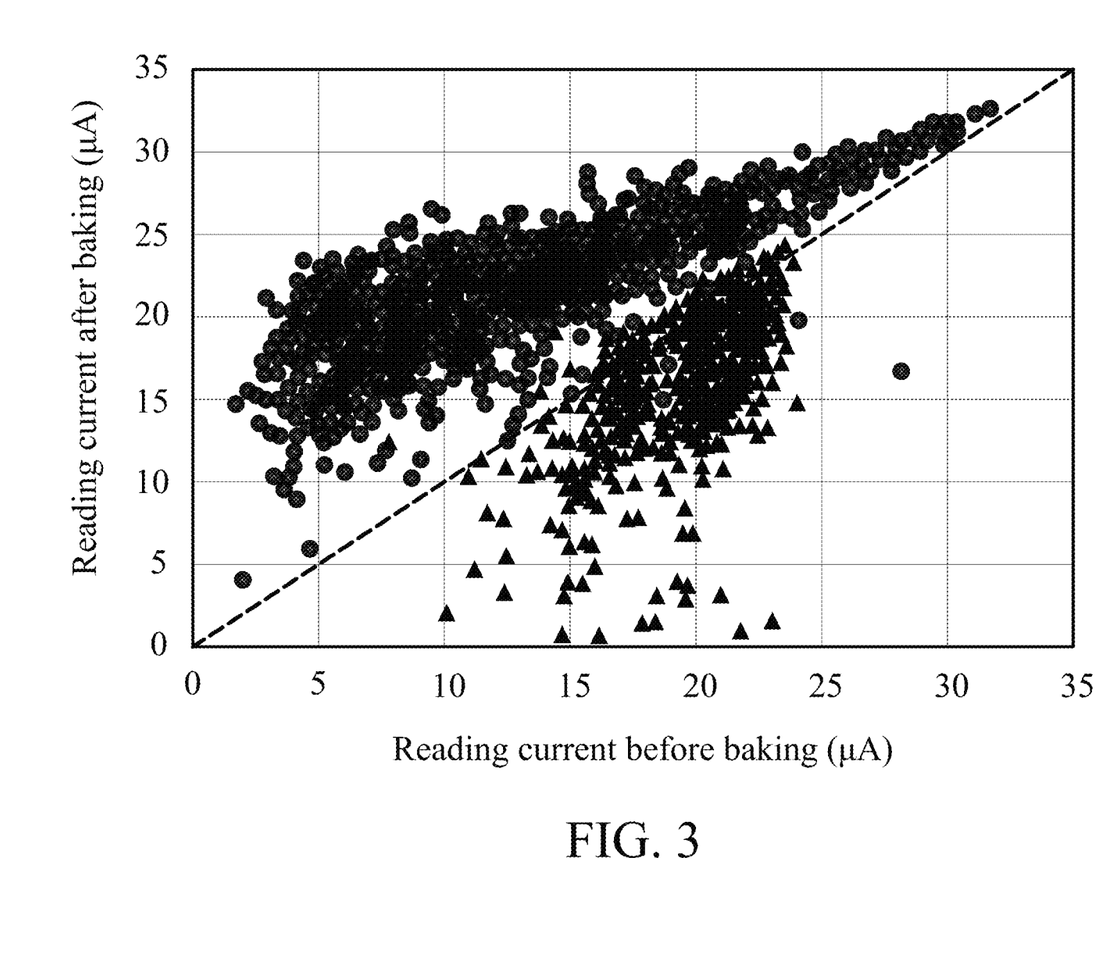
FIG. 3 is a graph of the reading currents of one-time-programmable resistive random access memory bits in accordance with some embodiments.

FIG. 3 is a graph of the reading currents of one-time-programmable resistive random access memory bits before and after baking in accordance with some embodiments. In the data with dot symbol, the resistive switching layer was subjected to the negative forming voltage and the baking. In the data with triangle symbol, the resistive switching layer was formed of the same material but subjected to the positive forming voltage and the baking.

As shown in FIG. 3, when the forming voltage is negative, the reading current after baking has increased. As mentioned above, more percolation paths are generated during baking and a wider reading current range allows more bits and further increases the bit density. On the other hand, when the forming voltage is positive, the reading current after baking has reduced. The vacancies in the one-time-programmable resistive random access memory bit are not randomly distributed but rather concentrated to form conductive filament. After baking, the vacancies diffuse out from the filament and the reading current has reduced. A narrow reading current range is not desirable for multiple bit memories.

Figure 4:
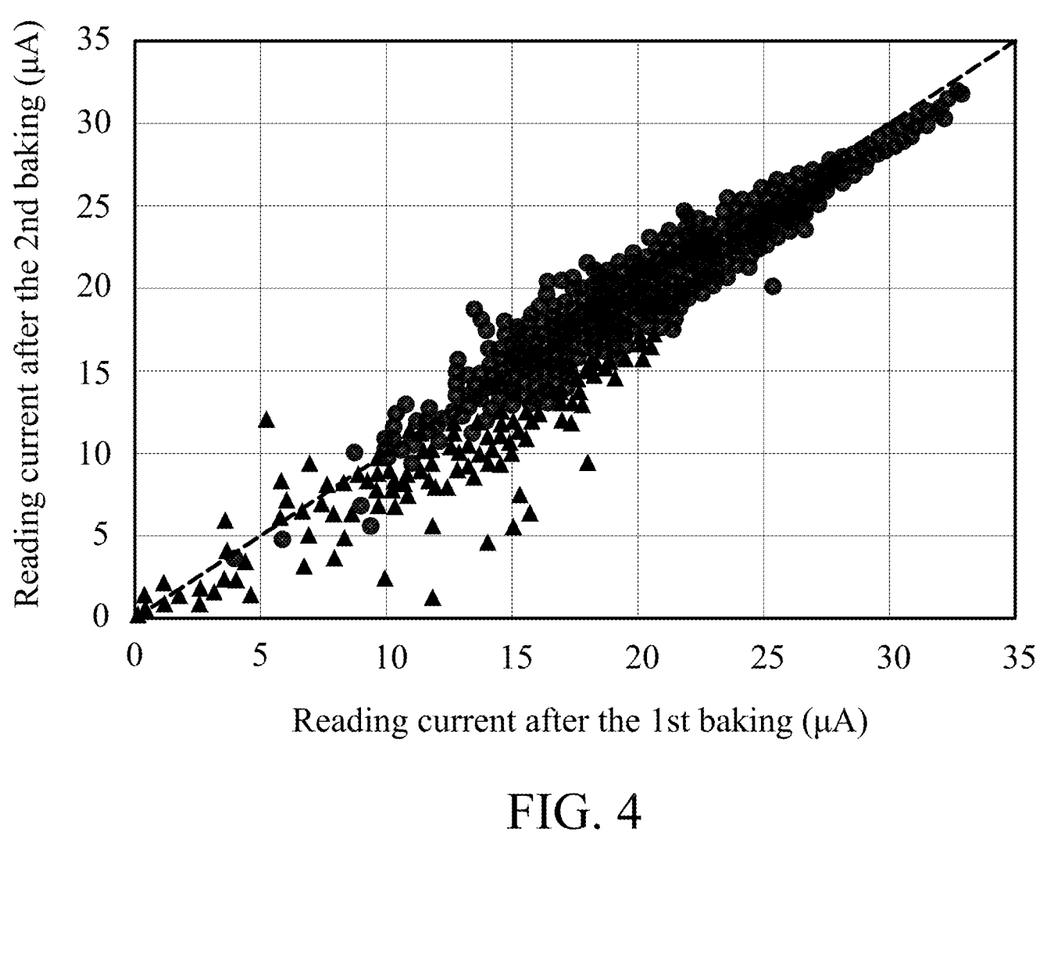
FIG. 4 is a graph of the reading currents of one-time-programmable resistive random access memory bits in accordance with some embodiments.

FIG. 4 is a graph of the reading currents of one-time-programmable resistive random access memory bits after two baking processes in accordance with some embodiments. In the data with dot symbol, the resistive switching layer was subjected to the negative forming voltage and two baking processes. In the data with triangle symbol, the resistive switching layer was form of the same material but subjected to the positive forming voltage and two baking processes.

It should be noted that the purpose of the first baking and the second baking in FIG. 4 are different. The first baking is to make the vacancies in the resistive switching layer more randomly distributed, and the second baking is for verifying high temperature data retention (HTDR) performance. In the step 204 of the method 200 in FIG. 2, only one bake is needed to make the vacancies more randomly distributed and enhance the reading current.

As shown in FIG. 4, when the forming voltage is negative, the reading current keeps the same before and after the second baking. That is, after the first baking, the data generally remains unchanged even after some other high-temperature thermal cycling. On the other hand, when the forming voltage is positive, some of the reading current after the second baking has reduced as the outliers shown in FIG. 4. The vacancies in the one-time-programmable resistive random access memory bit are not randomly distributed but rather concentrated to form conductive filament. After the second baking, the vacancies diffuse out from the filament and lower the reading current. Compared to the one-time-programmable resistive random access memory bit with a positive forming voltage, the high temperature data retention (HTDR) performance of the one-time-programmable resistive random access memory bit with a negative forming voltage is better.

Figure 5:
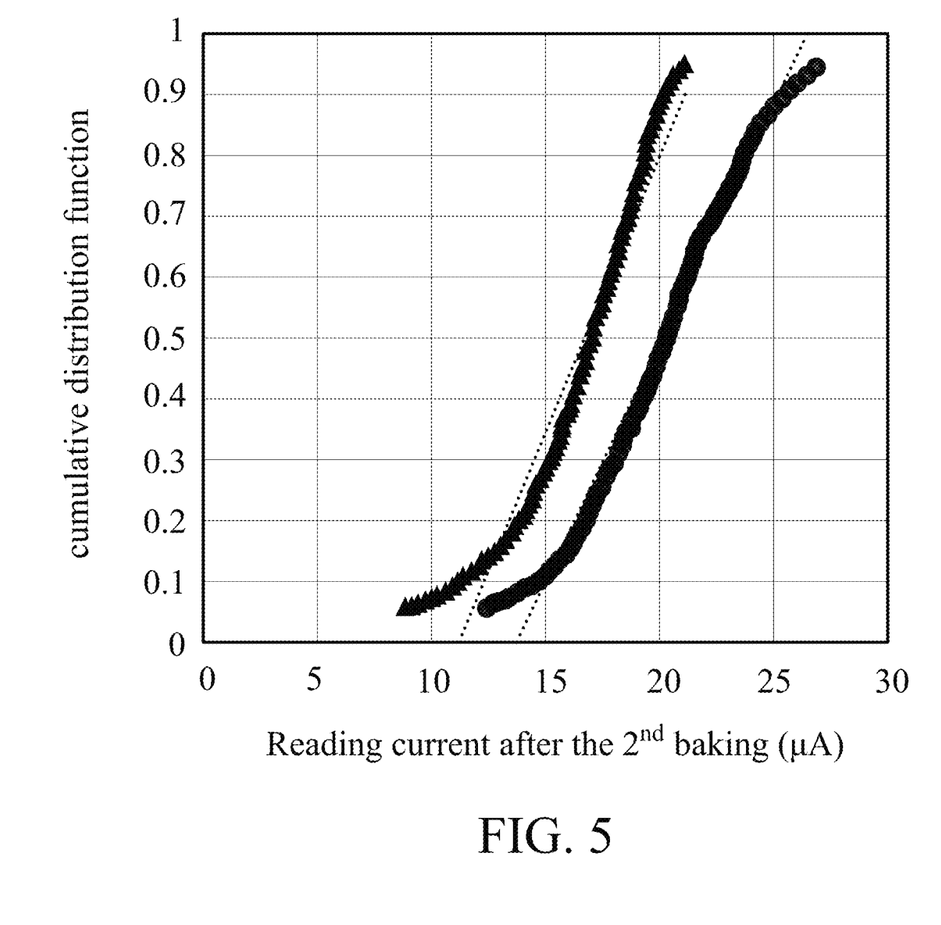
FIG. 5 is a graph of cumulative distribution function of the reading currents of one-time-programmable resistive random access memory bits in accordance with some embodiments.

FIG. 5 is a graph of the cumulative distribution function of the reading currents of one-time-programmable resistive random access memory bits after the second baking in accordance with some embodiments. In the data with dot symbol, the resistive switching layer was subjected to the negative forming voltage and two baking processes. In the data with triangle symbol, the resistive switching layer was formed of the same material but subjected to the positive forming voltage and two baking processes.

As shown in FIG. 5, when the forming voltage is negative, the cumulative distribution function of the reading current of the one-time-programmable resistive random access memory bit after the second baking is more linear and the reading current is more widely spread. The more linear of the cumulative distribution function of the reading current, the more uniform of the reading current. As mentioned above, a wider reading current range allows more bits and increases the bit density. On the other hand, when the forming voltage is positive, the cumulative distribution function of the reading current of the one-time-programmable resistive random access memory bit after the second baking is with a low-current tail and the reading current is more narrowly spread. The tailed distribution is due to degraded conductive filaments and a narrow reading current range is not desirable for multiple bit memories.

The results indicated in FIGS. 3-5 show that the resistive switching layer subjected to the negative forming voltage and baking helps to widen the reading current range and also improve the linearity of the cumulative distribution function of the reading current. The high temperature data retention (HTDR) performance is also enhanced.

Figure 6:
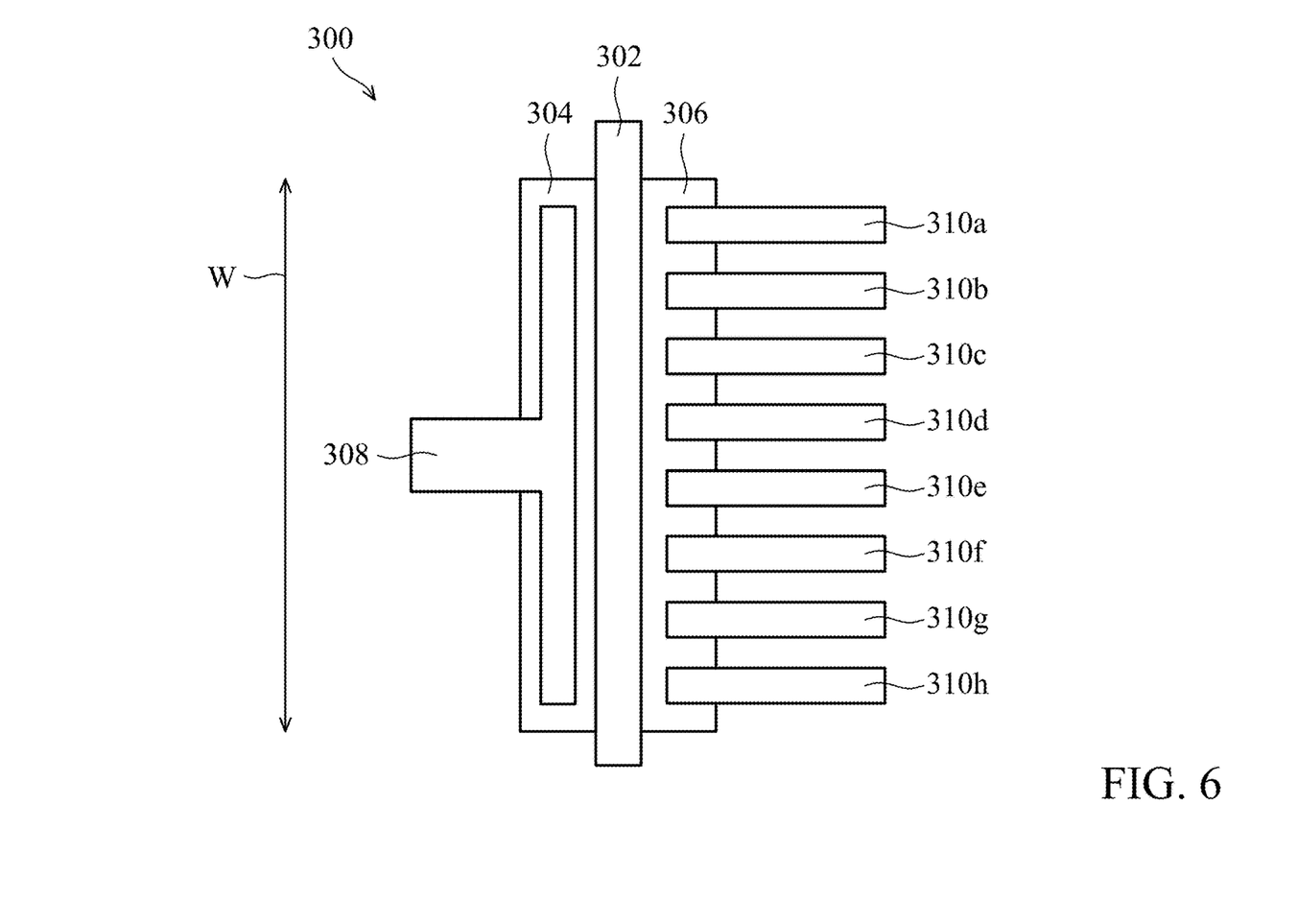
FIG. 6 is a layout of a one-time-programmable resistive random access memory in accordance with some embodiments.

FIG. 6 is a layout of a one-time-programmable resistive random access memory 300 in accordance with some embodiments. As shown in FIG. 6, the one-time-programmable resistive random access memory 300 includes a gate 302, a source 304, a drain 306, and one-time-programmable resistive random access memory bits 310a, 310b, 310c, 310d, 310e, 310f, 310g, and 310h. In some embodiments, the one-time-programmable resistive random access memory bits 310a-310h are parallel from a top view.

In some embodiments, the gate 302 is electrically connected to a word line (WL) (not shown), the source 304 is electrically connected to a source line (SL) 308, the drain 306 is electrically connected to the bottom electrode layers of the one-time-programmable resistive random access memory bits 310a-310h, and the top electrode layers of the one-time-programmable resistive random access memory bits 310a-310h are electrically connected to respective bit lines (BL) (not shown).

In some embodiments as shown in FIG. 6, to apply a negative forming voltage on the one-time-programmable resistive random access memory bits 310a-310h, the respective bit lines of the one-time-programmable resistive random access memory bits 310a-310h are grounded, the word line voltage is between 4V and 7V, and the source line voltage is between 3V and 6V. When one bit is operated on, the other bit lines must be open to prevent undesired current. In this way, the electric potential of the top electrode layers of one-time-programmable resistive random access memory bits 310a-310h is lower than that of the bottom electrode layers of one-time-programmable resistive random access memory bits 310a-310h, and a negative forming voltage is applied to the one-time-programmable resistive random access memory bits 310a-310h.

It should be noted that in FIG. 6 the drain 306 of the one-time-programmable resistive random access memory 300 electrically connects to eight one-time-programmable resistive random access memory bits 310a-310h. However, embodiments of the disclosure are not limited thereto. The drain 306 of the one-time-programmable resistive random access memory 300 may electrically connect to any number of one-time-programmable resistive random access memory bits, depending on the process and design demands.

As shown in FIG. 6, the gate width W of the one-time-programmable resistive random access memory 300 is between 0.4 μm to 20 μm. If the width W is too wide, the footprint is too large and may raise the cost. If the width is too narrow, the number of one-time-programmable resistive random access memory bits is not sufficient and the bit density decreases. Moreover, the required forming voltage is higher and the speed is slower.

Figure 7:
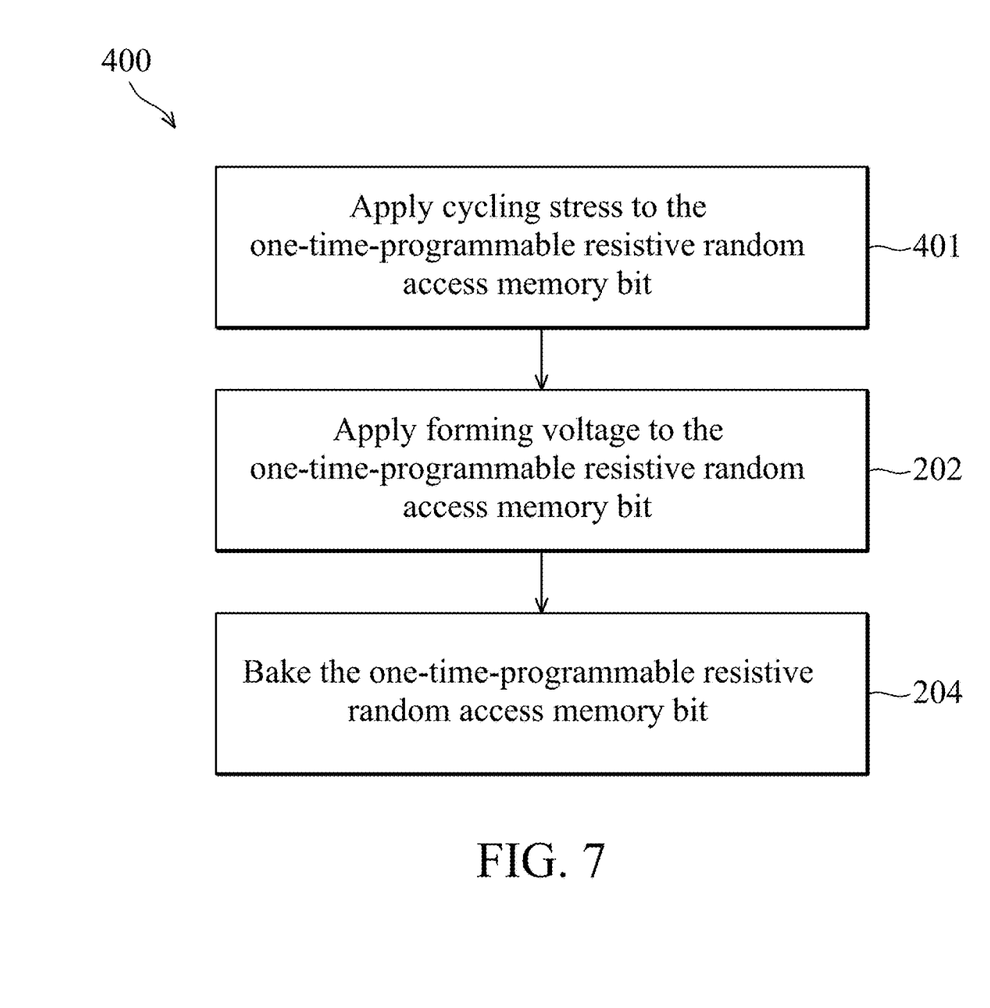
FIG. 7 is a flow chart of forming a one-time-programmable resistive random access memory bit in accordance with some embodiments.

FIG. 7 is a flow chart of a method 400 of forming a one-time-programmable resistive random access memory bit 100 in accordance with another embodiment. Some processes or devices are the same as, or similar to, those described in the embodiments above, and therefore they use the same symbols. For the purpose of brevity, the descriptions of these processes and devices are not repeated herein. The difference from the embodiments described above is that the method 400 further includes a step 401, in which a cycling stress is applied to the one-time-programmable resistive random access memory bit 100 before applying forming voltage. In some embodiments, performing the cycling stress comprises applying a cycling voltage to the resistive switching layer 106, making the electric potential of the top electrode layer 104 is alternately higher or lower than the electric potential of the bottom electrode layer 102.

Due to the cycling stress, the resistive switching layer 106 needs a stronger forming voltage to make the vacancies 108 in the resistive switching layer 106 randomly distributed. In some embodiments, the forming voltage is between 3 V and 6 V with a pulse width of between 100 ns and 100 μs. To apply a forming voltage on the one-time-programmable resistive random access memory bits in the one-time-programmable resistive random access memory as shown in FIG. 6, the respective bit lines of the one-time-programmable resistive random access memory bits are grounded, the word line voltage is between 4V and 8V, and the source line voltage is between 3V and 6V.

In the embodiments as shown in FIG. 7, even after a cycling stress, by applying a stronger negative forming voltage and performing a baking process on a one-time-programmable resistive random access memory bit, the vacancies in the resistive switching layer may be randomly distributed. The resistance of the one-time-programmable resistive random access memory bit and the reading current may be randomly values. Therefore, the reading currents from different one-time-programmable resistive random access memory bits may also be randomly distributed in a wide range. The reading current may be stable in thermal cycling, so the data generally remains unchanged even at high temperature.

As mentioned above, a one-time-programmable physical unclonable function is implemented by a resistive random access memory. In some embodiments, each memory bit of the one-time-programmable resistive random access memory may be subjected to the negative forming voltage and the baking. In some embodiments, the resistive switching layer of the one-time-programmable resistive random access memory bits may be formed of amorphous structure material or multi-grain material with small grain sizes. Therefore, the vacancies in the resistive switching layer may be randomly distributed. The resistance of the resistive switching layer and the reading current may be also random numbers. The reading current range may be widened and the linearity of the cumulative distribution function of the reading current may be improved. The high temperature data retention (HTDR) performance may be also enhanced.

While advantages associated with certain embodiments of the technology have been described in the embodiments, other embodiments may also exhibit such advantages. Not all embodiments need necessarily exhibit the above advantages to fall within the scope of the invention.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a one-time-programmable resistive random access memory (OTP RRAM) bit, comprising:
   forming a resistive switching layer on a bottom electrode layer;
   forming a top electrode layer on the resistive switching layer;
   applying a forming voltage to the resistive switching layer, such that the top electrode layer has a negative voltage respect to a voltage of the bottom electrode layer, wherein vacancies in the resistive switching layer are randomly distributed after applying the forming voltage to the resistive switching layer; and
   performing a bake process on the resistive switching layer;
   wherein the vacancies in the resistive switching layer are more randomly distributed after applying the forming voltage and performing the bake process on the resistive switching layer than before applying the forming voltage to the resistive switching layer.

2. The method for forming a one-time-programmable resistive random access memory bit as claimed in claim 1, wherein the resistive switching layer is an amorphous structure.

3. The method for forming a one-time-programmable resistive random access memory bit as claimed in claim 2, wherein forming of the resistive switching layer is under a temperature of 250° C. and 300° C.

4. The method for forming a one-time-programmable resistive random access memory bit as claimed in claim 2, wherein the resistive switching layer comprises $HfO_2$ or $ZrO_2$ doped by Al, Si, N, Ta, or Ti.

5. The method for forming a one-time-programmable resistive random access memory bit as claimed in claim 1, wherein the resistive switching layer has a thickness of between 1 nm and 3 nm.

6. The method for forming a one-time-programmable resistive random access memory bit as claimed in claim 1, wherein the resistive switching layer is a multi-grain structure with a grain size of between 1 nm to 200 nm.

7. The method for forming a one-time-programmable resistive random access memory bit as claimed in claim 1, wherein the forming voltage is between 3 V and 6 V, and the forming voltage provides a current between 500 μA and 600 μA and a pulse width between 1 μs and 100 μs.

8. The method for forming a one-time-programmable resistive random access memory bit as claimed in claim 1, wherein the bake process has a temperature of between 200° C. and 300° C., and the bake process has a duration time of between 1 minute and 300 minutes.

9. The method for forming a one-time-programmable resistive random access memory bit as claimed in claim 1, wherein the top electrode layer comprises metal nitride, TaN, TiN, TiAlN, TiW, WN, Ti, Au, Ta, Ag, Cu, AlCu, Pt, W, Ru, Al, or Ni.

10. The method for forming a one-time-programmable resistive random access memory bit as claimed in claim 1, wherein the vacancies are oxygen or nitrogen vacancies.

11. The method for forming a one-time-programmable resistive random access memory bit as claimed in claim 1, further comprising:
    performing a cycling stress before applying the forming voltage to the resistive switching layer;
    wherein performing the cycling stress comprises applying a cycling voltage to the resistive switching layer, such that the electric potential of the top electrode layer is alternately higher or lower than the electric potential of the bottom electrode layer.

12. The method for forming a one-time-programmable resistive random access memory bit as claimed in claim 11, wherein the forming voltage is between 3 V and 6 V with a pulse width of between 100 ns and 100 μs.

* * * * *